(12) United States Patent
Nyholm

(10) Patent No.: US 6,242,274 B1
(45) Date of Patent: Jun. 5, 2001

(54) METHOD OF MOUNTING A CHIP ON A FLEXIBLE FOIL SUBSTRATE FOR POSITIONING ON A CAPSULE

(75) Inventor: Leif Ingmar Nyholm, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/077,369

(22) PCT Filed: Nov. 27, 1996

(86) PCT No.: PCT/SE96/01556

§ 371 Date: Dec. 3, 1998

§ 102(e) Date: Dec. 3, 1998

(87) PCT Pub. No.: WO97/20344

PCT Pub. Date: Jun. 5, 1997

(30) Foreign Application Priority Data

Nov. 29, 1995 (SE) .................................................... 9504271

(51) Int. Cl.7 .................................................... H01L 21/00
(52) U.S. Cl. .............................. 438/27; 438/65; 438/108; 438/125
(58) Field of Search ................................ 438/48, 64, 26, 438/51, 27, 106, 108, 125, 65; 257/432, 433, 704; 385/49, 50, 52, 88, 92

(56) References Cited

U.S. PATENT DOCUMENTS

| 4,104,728 | 8/1978 | Kasubuchi ................................ 364/712 |
| 4,415,983 | 11/1983 | Lachmann et al. ........................ 364/708 |
| 5,168,537 | 12/1992 | Rajasekharan et al. ................... 385/89 |
| 5,199,093 | 3/1993 | Longhurst ............................... 385/88 |
| 5,230,030 | 7/1993 | Hartman et al. .......................... 395/50 |
| 5,249,245 | 9/1993 | Lebby et al. ............................. 385/89 |
| 5,302,778 | * 4/1994 | Maurinus ............................... 257/432 |
| 5,306,948 | * 4/1994 | Yamada et al. .......................... 257/704 |
| 5,309,537 | 5/1994 | Chun et al. .............................. 385/59 |
| 5,337,391 | 8/1994 | Lebby .................................... 385/88 |
| 5,367,593 | * 11/1994 | Lebby et al. ............................ 385/53 |
| 5,420,954 | 5/1995 | Swirhun et al. .......................... 385/92 |
| 5,467,419 | * 11/1995 | Roff et al. ............................... 385/92 |
| 5,998,878 | * 12/1999 | Johnson ................................. 257/433 |

FOREIGN PATENT DOCUMENTS

| 0 585 186 | 3/1994 | (EP) . |
| 3-60080 | * 3/1991 | (JP) . |
| 6-53454 | * 2/1994 | (JP) . |
| 94/11929 | 5/1994 | (WO) . |

* cited by examiner

Primary Examiner—Olik Chaudhuri
Assistant Examiner—Alonzo Chambliss
(74) Attorney, Agent, or Firm—Burns, Doane, Swecker & Mathis, L.L.P.

(57) ABSTRACT

With the intention of simplifying an arrangement of a chip having at least one optical active surface and positioning the chip in a correct position in relation to an optical miniature capsule for optimum light transmission between an optical fiber and the optically active surface, the chip (1) is fastened on a foil substrate (9) which has at least one conductor (4) and which is provided with alignment marks and/or guide means (8) for correct positioning of the chip on the foil substrate and for correct positioning of the foil substrate/chip assembly on the capsule. After having fastened the chip on the foil substrate, the foil with the chip can be readily fastened to the capsule and by that means the chip will be fastened to the capsule. By using guide means, for instance contact element guide pins on the capsule, the foil substrate/chip assembly can be positioned correctly in relation to the capsule, such that the ends of the optical fibers in the contact element will lie opposite to and in contact with the optically active surfaces of the chip and therewith provide optimum light transmission.

10 Claims, 4 Drawing Sheets

METHOD OF MOUNTING A CHIP ON A FLEXIBLE FOIL SUBSTRATE FOR POSITIONING ON A CAPSULE

FIELD OF THE INVENTION

The present invention relates to a method of mounting on a unit a chip that has at least one optical active surface and to an arrangement for mounting on a unit a chip that has at least one optical surface, such as for mounting a chip on an optical miniature capsule. Surface mounted and/or encapsulated optoelectrical elements, such as photo-detectors (PD), light-emitting diodes (LED) or laser diodes (LD), possibly integrated with other electronic elements, are often mounted on miniature capsules so as to be easy to handle.

DESCRIPTION OF THE PRIOR ART

When using an optical fibre for high speed communication, a permanent connection is often provided between the optical fibre and an active surface on an optical component, such as an optical transmitter or an optical receiver. This connection requires the end of the optical fibre to be matched very precisely with a well-defined region on the optical component. It is therefore usual for the component to be encapsulated together with a permanently mounted optical fibre length, a so-called pigtail, such that a small permanently mounted fibre will constantly hang from the capsule 100. The encapsulation may be effected hermetically with a metal or ceramic material. This component encapsulating method is time-consuming, highly expensive, takes up a large volume and does not permit the encapsulated components to be connected to and released from an optical fibre.

U.S. Pat. Nos. 5,168,537, 5,199,093, 5,230,030, 5,249,245, 5,309,537, 5,337,391 and 5,420,954 teach earlier known methods and arrangements for connecting optical fibres to optical transmitters or receivers with the aid of some form of interconnecting means, where the separate optical fibre end is brought directly onto an active surface on an optoelectrical element with the aid of different types of guide means.

SUMMARY OF THE INVENTION

With the intention of simplifying an arrangement of a chip having at least one optical active surface and positioning the chip in a correct position in relation to an optical miniature capsule for optimum light transmission between an optical fibre and the optically active surface, the chip is fastened on a foil which has at least one conductor and which is provided with alignment marks and/or guide means for correct positioning of the chip on the foil and for correct positioning of the foil and the mounted chip on the capsule.

After having fastened the chip on the foil, the foil and chip assembly can be readily fastened to the capsule. By using guide means, for instance contact element guide pins on the capsule, the foil and chip assembly can be positioned correctly in relation to the capsule, such that the ends of the optical fibres in the contact element will lie opposite to and in contact with the optically active surfaces of the chip and therewith provide optimum light transmission.

DESCRIPTION OF THE PREFERRED EMBODIMENTS

Figure 1:
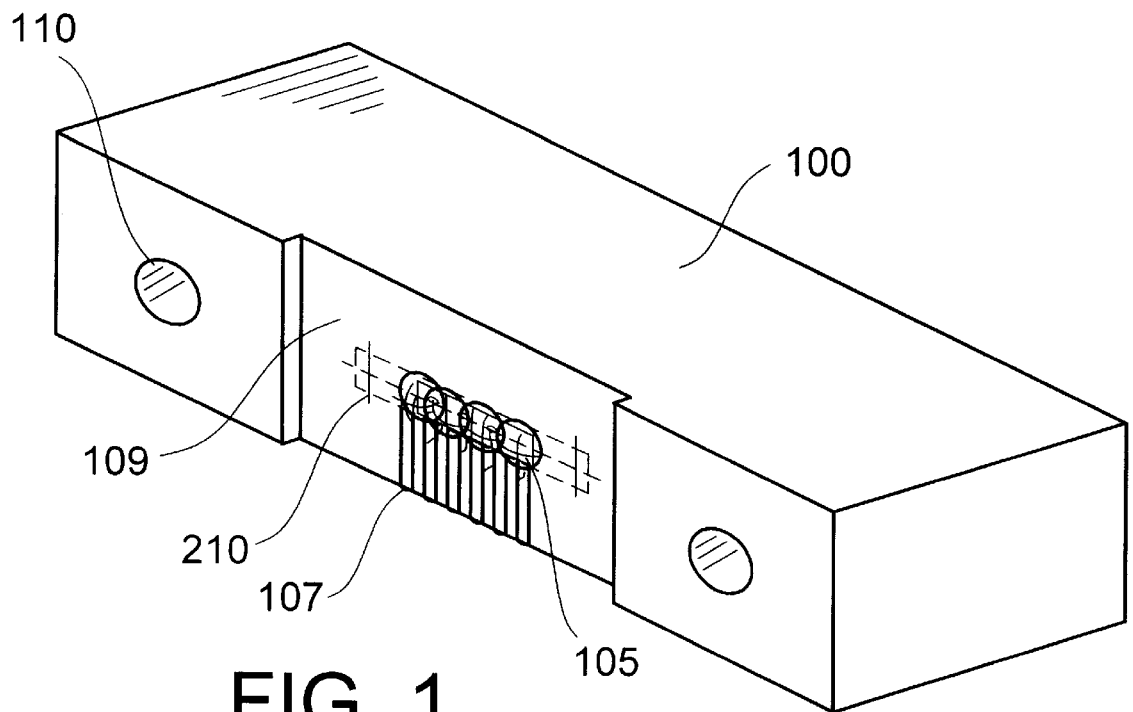
FIG. 1 illustrates an optical miniature capsule arrangement according to an earlier known technique.

FIG. 1 illustrates the construction of a known module or so-called optical miniature capsule with certain optoelectrical components 15, and also shows a conceivable arrangement of the module on a substrate, such as a circuit board or like device. An optical multi-fibre cable or ribbon fibre having several mutually adjacent optical fibres is provided with a capsule connector having guide pins which when connecting the connector to the capsule function to position the connector accurately in relation to the capsule, by virtue of the guide pins on the connector entering accurately matching guide holes 110 provided in the front side of the capsule. The reference numeral 107 identifies electric conductor paths which extend from the optoelectrical components 105 straight down to an underside of the capsule. Included on the front side of the capsule is a shallow recess 109 in which the components 115 can be mounted in a sunken position relative to the remaining parts of the front side of the capsule or module. When inserting the guide pins on the optical connector into the guide holes in the capsule, this arrangement enables a controlled distance to be obtained between the outer connection surfaces of the optical components and corresponding surfaces on the optical connector, normally the end surfaces of the optical fibres in the fibre cable. This enables damage to the connection surfaces as a result of the pressure exerted when mounting the optical connector to be avoided. The front side of the capsule may include markings 210 in the form of alignment crosses or the like which function to enable the optical components to be positioned accurately on the front side of the capsule 100 relative to the position of the guide-pin receiving holes 110.

Figure 2:
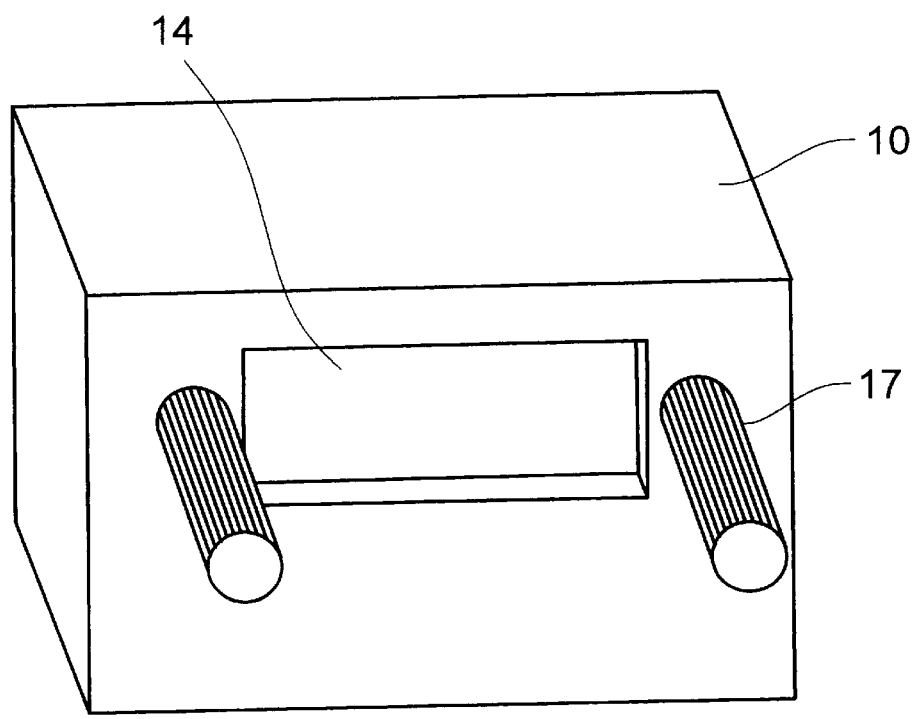
FIG. 2 illustrates an optical miniature capsule arrangement in accordance with the invention having room for one chip and guide pins.

FIG. 2 illustrates a module/optical miniature capsule 10 constructed in accordance with the invention and having a chip-receiving recess portion 14 and guide pins 17 for an optical fibre connector.

Figure 3A:
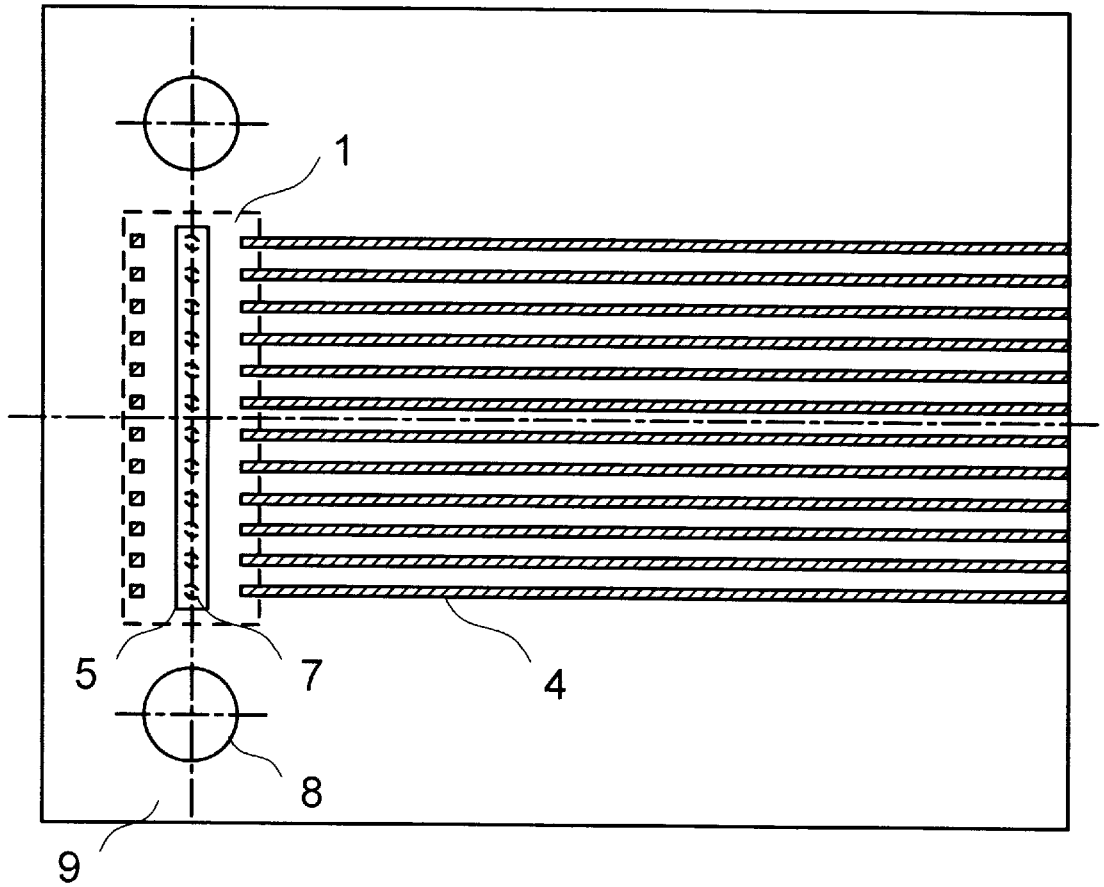
FIG. 3a illustrates a foil substrate which carries conductors and an underlying chip having optically active surfaces in accordance with the invention.
Figure 3B:
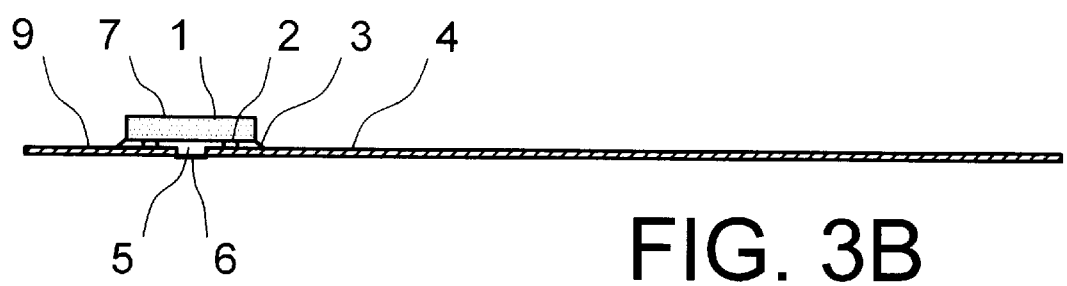
FIG. 3b illustrates the foil substrate with the chip shown in FIG. 3a and overlying conductors.
Figure 3C:
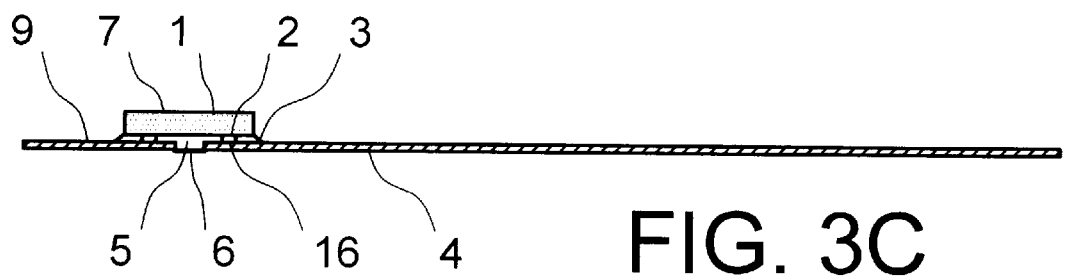
FIG. 3c illustrates the foil strip and the chip shown in FIG. 3a with underlying conductors.
Figure 4A:
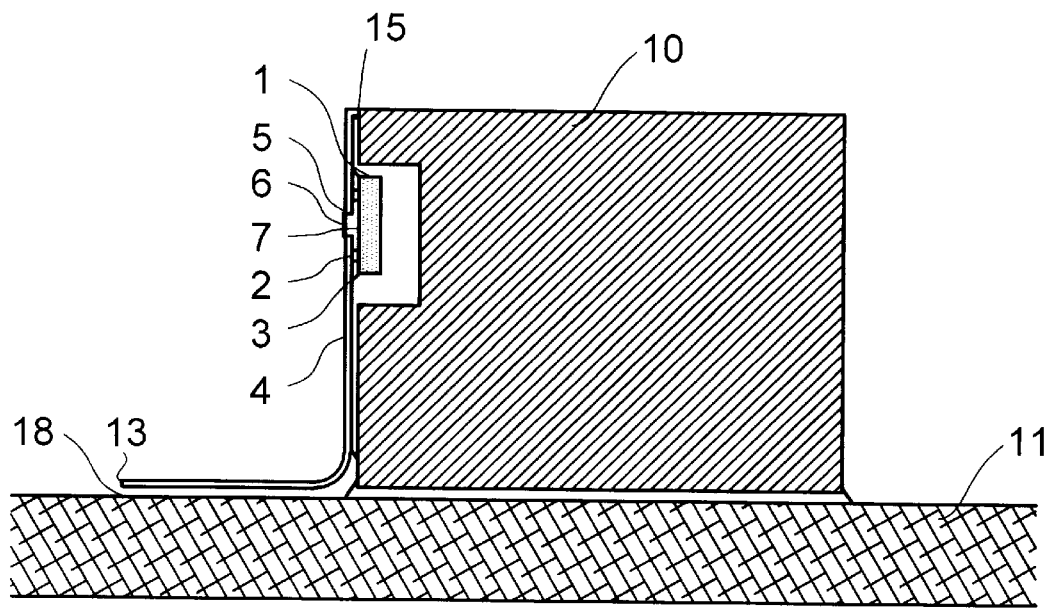
FIG. 4a illustrates an optical miniature capsule which includes a foil-mounted chip according to the invention with overlying conductors.
Figure 4B:
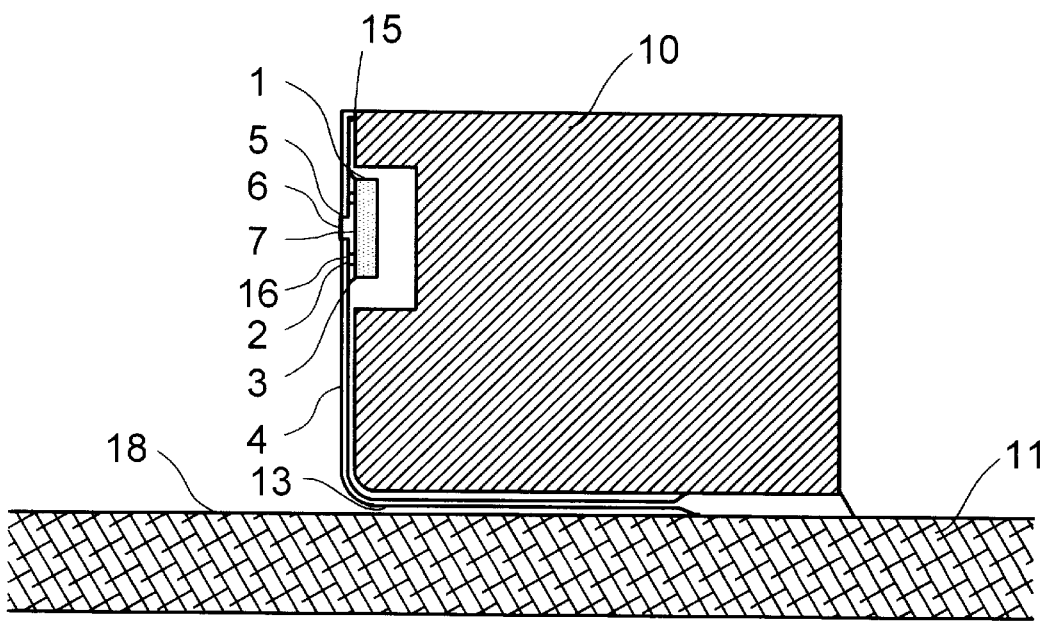
FIG. 4b illustrates an optical miniature capsule which includes a foil-mounted chip according to the invention with underlying conductors.

FIGS. 3a–c illustrate a module/miniature capsule electrical connection arrangement which includes a soft foil substrate 9 comprised of a polymeric material, for instance a polymide, with a metal foil, preferably copper foil, on one side or on both sides of a so-called flex foil. The copper foil is circuit-printed for the electrical connection between a chip 1 and a circuit board 11. The chip may be mounted on the foil substrate 9 by the so-called flip chip technique, so that the active surfaces 7 of the chip will face towards the foil substrate. The foil substrate has an opening 5 which lies opposite the active surfaces of the chip. The bond of the flip chip to the foil substrate can be further enhanced with the aid of glue 3 which in the illustrated case may be a transparent glue. The glue may be applied so as to fill in the foil opening, either partially or completely. However, no opening is required when sufficiently good life transmission is obtained through the foil substrate. A thin, transparent and rubbery film 6 can be applied to the rear side of the foil substrate at positions corresponding to the positions of the active surfaces. The foil substrate with holes 8 for receiving guide pins 17 on the capsule 10 is placed on these pins with the chip received in the recess 14 in the module/capsule. The chip and the foil substrate can be bonded to the capsule with glue 15, see FIGS. 4a and 4b. When connecting a connector, the thin, transparent rubbery film 6 will prevent the formation of an air gap between the connector and the component. For instance, when the flip chip bumps 2 have a height of 50–75 $\mu$m, the copper foil substrate 9 has a thickness of 10 $\mu$m, the polymeric foil 9 has a thickness of 25 $\mu$m, and the film 6 has a thickness of 20 $\mu$m, the total distance between the connector fibres and the chip surface will be 100–130 $\mu$m, which is considered to be a sufficiently short distance.

There are, in the main, two ways of achieving electrical connection between chip and circuit board on the flex foil, the difference therebetween being governed by the side of the flex foil on which the conductors 4 lie. If the conductors lie on the same side as the chip, as in the FIG. 3b illustration, the foil substrate is bent "forwards", see FIG. 4a, and not beneath the capsule when mounting on a circuit board 11 and is connected with the conductors 18 on the circuit board 11 either with solder or a conductive glue 13. If the conductors lie instead on the opposite side to the chip-mounted side, see FIG. 3c, the conductors are bent beneath the module, see FIG. 4b, and connected with the circuit board mounted conductors with solder or a conductive glue 13. In this latter case, the chip on one side of the foil substrate is connected to the conductors on the other side of the foil substrate through the medium of holes 16.

The active surfaces of the chip can either be positioned relative to the guide pins in the module as the chip is placed on the foil substrate or as the foil substrate is mounted on the module. In the former case, there can be used a mounting machine capable of placing the chip relative to the holes 8 with sufficient precision in the order of about 5 $\mu$m.

Figure 5A:
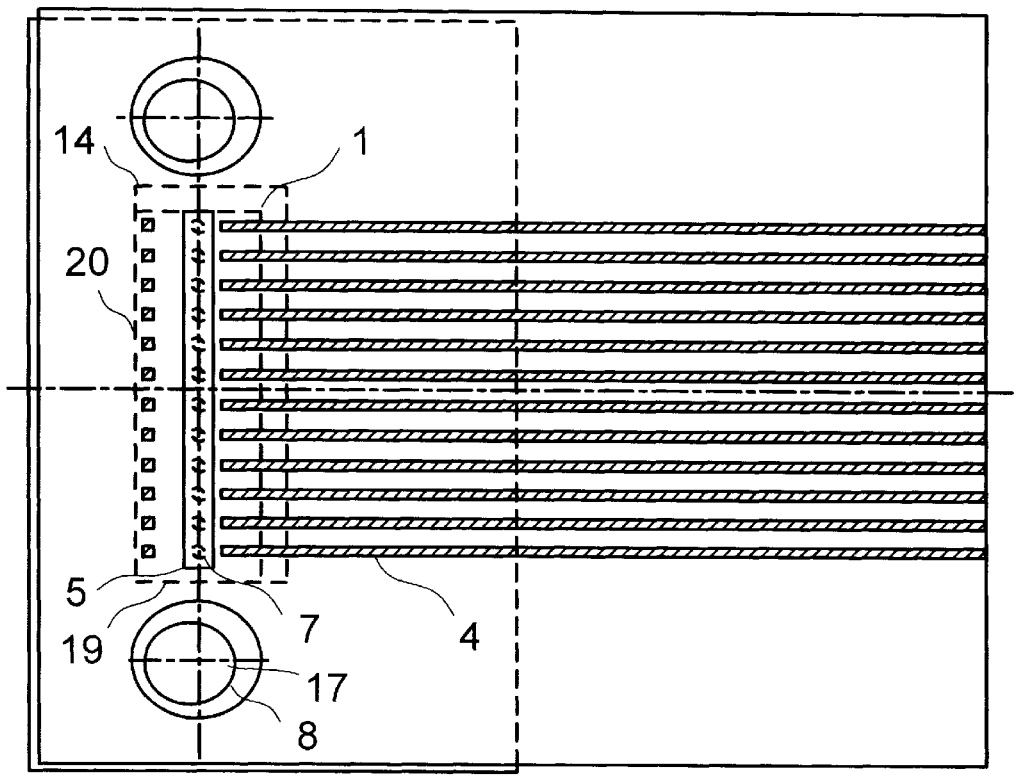
FIGS. 5a and 5b illustrate an optical miniature capsule which includes guide means and a foil-mounted chip according to the invention, said Figures showing the miniature capsule respectively from above and from one side thereof.
Figure 5B:
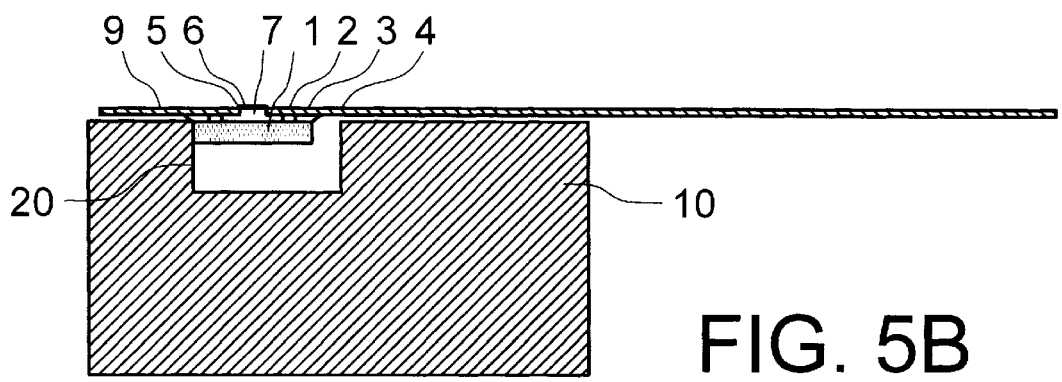

There may be used a "visual" system that can refer to the outer edges of the chip or to chip-carried alignment marks and place these edges or marks correctly in relation to the holes in the foil substrate. When these holes have the same diameter as the guide pins 17, the chip will be positioned correctly in relation to the guide pins when the foil substrate/chip assembly is fitted onto the pins. In the latter case, see FIGS. 5a and 5b two of the edges 19, 20 of the recess 14 have been given sufficient accuracy in relation to the guide pins 17. The foil substrate/chip assembly is then fitted onto the guide pins and the outer edges of the chip pressed against the well-defined edges 19, 20 prior to gluing the foil substrate/chip assembly. This latter case requires the holes in the foil substrate 8 to be slightly larger than the diameter of the guide pins. Instead of using the edges in the module recess, a metal foil or plastic foil of well-defined profile can be fitted prior to fitting the foil with the chip. This foil may also have edges that are well-defined in relation to said holes, similar to the aforementioned edges of the module recess and therewith provide well-defined positioning of the foil substrate/chip assembly.

That which is claimed is:

1. A method of mounting a chip having at least one optically active surface correctly in relation to a unit for optimum light transmission between an optical fiber and the optically active surface, the method comprising: fastening the chip on a flexible foil substrate which includes at least one conductor for electrical contact with the chip thereby forming a foil substrate/chip assembly; providing the foil substrate with at least one of alignment marks and guide means for positioning the chip correctly on the foil substrate; providing the foil substrate with holes adapted to mate with guide pins thereby correctly positioning of the foil substrate on the unit; providing the unit with a well-defined recess adapted to receive the chip; fastening the foil substrate/chip assembly to the unit; and bending the foil substrate towards or away from the unit.

2. The method of claim 1, wherein said unit is an optical miniature capsule.

3. The method of mounting a chip according to claim 1, wherein said step of mounting said chip on said unit comprises gluing said chip to said foil substrate.

4. The method of claim 1, further comprising steps of fastening said foil substrate/chip assembly to the unit, and attaching said at least one conductor of said foil substrate to said circuit board by bending the foil substrate towards or away from the unit so that at least a portion of said foil substrate lies adjacent and parallel to said circuit board.

5. An arrangement for correctly positioning a chip having at least one optically active surface on a unit for optimum light transmission between an optical fiber and the optically active surface, the unit adapted to be mounted on a circuit board, wherein the arrangement comprises the chip fastened to a flexible foil substrate which includes at least one conductor for electrical contact with the chip forming a foil substrate/chip assembly, the foil substrate is provided with at least one of alignment marks and guide means for positioning the chip correctly on the foil substrate, the foil substrate provided with holes adapted to mate with guide pins thereby correctly positioning the foil substrate/chip assembly on the unit; the unit provided with a well-defined recess adapted to receive the chip when mounting the foil substrate/chip assembly on the unit; and the attachment between the foil substrate/chip assembly and the unit being such that the foil substrate is bent toward or away from the unit upon mounting the unit to the circuit board.

6. The arrangement of claim 5, wherein said unit is an optical miniature capsule.

7. The arrangement of claim 5, wherein said chip is fastened to said foil substrate by glue.

8. The arrangement according to claim 5, further comprising a circuit board, said unit being fastened to said circuit board.

9. The arrangement according to claim 8, wherein said unit is fastened to said circuit board by glue.

10. The arrangement according to claim 8 wherein said foil substrate is electrically connected to said circuit board and is sufficiently flexible to bend at various angles with respect to the chip.

\* \* \* \* \*